United States Patent
Itoh et al.

(10) Patent No.: US 7,667,132 B2
(45) Date of Patent: Feb. 23, 2010

(54) ELECTRIC POWER GENERATING APPARATUS AND CONTROL METHOD FOR ELECTRIC POWER GENERATING APPARATUS

(75) Inventors: Yuji Itoh, Susono (JP); Kiyohito Murata, Susono (JP)

(73) Assignee: Toyota Jidosha Kabushiki Kaisha, Toyota-shi, Aichi-ken (JP)

(*) Notice: Subject to any disclaimer, the term of this patent is extended or adjusted under 35 U.S.C. 154(b) by 877 days.

(21) Appl. No.: 11/049,685

(22) Filed: Feb. 4, 2005

(65) Prior Publication Data

US 2005/0178425 A1 Aug. 18, 2005

(30) Foreign Application Priority Data

Feb. 17, 2004 (JP) ............................. 2004-040407

(51) Int. Cl.
*H01L 35/30* (2006.01)
*H01L 37/00* (2006.01)
*H01L 35/00* (2006.01)

(52) U.S. Cl. ................. 136/205; 136/203; 136/204; 52/173.1; 60/324

(58) Field of Classification Search ................ None
See application file for complete search history.

(56) References Cited

U.S. PATENT DOCUMENTS 6,681,583 B2 * 1/2004 Taguchi .................. 62/133

2003/0223919 A1 12/2003 Kwak et al.

FOREIGN PATENT DOCUMENTS

| GB | 2 336 943 | 11/1999 |
| JP | 61-254082 | 11/1986 |
| JP | 63-262075 | 10/1988 |
| JP | A-6-22572 | 6/1992 |
| WO | WO 2004/059138 A1 | 7/2004 |
| WO | WO 2004/059139 A1 | 7/2004 |

OTHER PUBLICATIONS

Kawai et al., JP 06-022572A online machine translation, Jan. 1994.*

* cited by examiner

*Primary Examiner*—Jennifer K Michener
*Assistant Examiner*—Golam Mowla
(74) *Attorney, Agent, or Firm*—Finnegan, Henderson, Farabow, Garrett & Dunner, LLP

(57) ABSTRACT

When electric power is obtained from a thermoelectric element, a value of electric current is changed, and two combinations of the electric current value and a voltage value ($i_1$, $V_1$) and ($i_2$ and $V_2$) are obtained. An electric current value $i_t$ at which the maximum electric power Wmax can be obtained is obtained using an electric current-voltage characteristic estimated based on the obtained two combinations of the electric current value and the voltage value. The electric current is controlled such that the value of the electric current becomes equal to the obtained value $i_t$ when the electric power is obtained from the thermoelectric element. The value $i_t$ is represented by an equation, $$i_t = (i_2 V_1 - i_1 V_2)/2(V_1 - V_2).$$

4 Claims, 9 Drawing Sheets

US 7,667,132 B2

ELECTRIC POWER GENERATING APPARATUS AND CONTROL METHOD FOR ELECTRIC POWER GENERATING APPARATUS

INCORPORATION BY REFERENCE

The disclosure of Japanese Patent Application No. 2004-40407 filed on Feb. 17, 2004 including the specification, drawings and abstract is incorporated herein by reference in its entirety.

BACKGROUND OF THE INVENTION

1. Field of the Invention

The invention relates to an electric power generating apparatus using a thermoelectric element. More particularly, the invention relates to control of generated electric power in an electric power converter in an electric power generating apparatus which is provided in an exhaust system of an automobile or the like, and which supplies electric power generated due to a temperature difference between exhaust gas and a cooling medium, using the electric power converter.

2. Description of the Related Art

A thermoelectric power generating apparatus is known, which recovers, as electric power, heat energy contained in exhaust gas discharged from a combustion device such as an engine of an automobile. In such a thermoelectric power generating apparatus, one end of a thermoelectric element is heated by exhaust gas, and the other end of the thermoelectric element is cooled by a cooling medium such as coolant, whereby electric power is generated in the thermoelectric element due to a temperature difference between the exhaust gas and the cooling medium. After the voltage of the generated electric power is increased and smoothed by the electric power converter, the electric power is supplied to a battery and the like.

Meanwhile, output electric power of the thermoelectric element varies depending on an electric current value when the output electric power is obtained. Further, this electric current-electric power (voltage) characteristic varies also depending on a temperature at each of both ends of the thermoelectric element. Accordingly, as disclosed in Japanese Patent Application Publication No. JP-A-6-22572, in order to efficiently obtain electric power when a condition on a high-temperature side of the thermoelectric element and a condition on a low-temperature side of the thermoelectric element change, for example, when electric power is generated using exhaust gas of an automobile, it is necessary to control electric current when the electric power is obtained according to the electric current-electric power (voltage) characteristic. In this technology, a temperature on the high-temperature side of the thermoelectric element and a temperature on the low-temperature side of the thermoelectric element are measured; an electric current value at which the output electric power becomes optimal is obtained based on an output characteristic of the thermoelectric element at the measured temperatures, the output characteristic being obtained in advance; and the electric current is controlled to become equal to the obtained electric current value when the electric power is obtained.

In order to closely attach temperature sensors on the high-temperature side and the low temperature side of the thermoelectric element, a fixing member such as a spacer is required. The fixing member and the temperature sensors serve as thermal resistance. As a result, the amount of heat transmitted in the thermoelectric element is decreased, and electric power generation efficiency is also reduced. Also, ordinarily, multiple thermoelectric elements are connected in order to increase the amount of generated electric power. However, since temperatures at both ends of the thermoelectric element vary with each thermoelectric element, it is difficult to detect overall tendency in the temperatures using the small number of temperature sensors. Meanwhile, if the number of the temperature sensors is increased, cost is increased, and the electric power generation efficiency is reduced. Therefore, increasing the number of the temperature sensors is also difficult. Also, in order to accurately detect a transient change in the temperatures, it is necessary to enhance responsiveness of the temperature sensors. Particularly when responsiveness of the temperature sensor on the high-temperature side is enhanced, the cost is increased.

SUMMARY OF THE INVENTION

Accordingly, it is an object of the invention to provide an electric power generating apparatus using a thermoelectric element, which makes it possible to efficiently obtain electric power without requiring temperature measurement.

In order to achieve the aforementioned object, a first aspect of the invention relates to an electric power generating apparatus including a thermoelectric element; and an electric power converter which controls electric current when the thermoelectric element generates electric power. The electric power converter changes the electric current when the thermoelectric element generates the electric power so as to obtain voltage values $V_1$ and $V_2$ corresponding to at least two different electric current values $i_1$ and $i_2$, the electric current value $i_1$ being smaller than the electric current value $i_2$; and the electric power converter controls the electric current such that a value of the electric current becomes equal to an electric current value $i_r$ when the thermoelectric element generates the electric power, the electric current value $i_r$ satisfying an equation, $$i_r = (i_2 V_1 - i_1 V_2)/2(V_1 - V_2).$$

An electric current (i)-voltage (V) characteristic of the thermoelectric element varies depending on a temperature on a high-temperature side of the thermoelectric element and a temperature on a low-temperature side of the thermoelectric element. Ordinarily, the electric current (i)-voltage (V) characteristic is represented by an equation, $V = V_0 - k \times i$ (in this equation, $0 \leq i \leq V_0/k$. The values of $V_0$ and k vary depending on the temperature on the high-temperature side of the thermoelectric element and the temperature on the low-temperature side of the thermoelectric element. Refer to FIG. 3). Thus, output electric power W is represented by an equation, $W = i \times (V_0 - k \times i) = i \times V_0 - k \times i^2$. Accordingly, the maximum electric power Wmax is obtained in the case of "dW/di=0", that is, in the case of "$i_r = V_0/(2 \times k)$". In the case where combinations of the electric current value and the voltage value ($i_1$, $V_1$) and ($i_2$, $V_2$) are obtained when the temperatures on the high-temperature side and the low-temperature side of the thermoelectric element are given temperatures, the electric current value $i_r$ at which the maximum electric power can be obtained is calculated according to an equation, $$i_r = (i_2 V_1 - i_1 V_2)/2 \times (V_1 - V_2).$$

In the first aspect of the invention, the electric power converter may include an ammeter that measures a value of electric current flowing in the thermoelectric element, and a voltmeter that measures a value of voltage between output terminals of the thermoelectric element.

In the first aspect of the invention, the thermoelectric element may include a high-temperature side end surface and a low-temperature side end surface, and generates the electric power according to a temperature difference between the high-temperature side end surface and the low-temperature side end surface.

In the first aspect of the invention, the high-temperature side end surface may be provided in a vicinity of an exhaust passage of an automobile, and a cooling device is provided on the low-temperature side end surface.

A second aspect of the invention relates to an electric power generating apparatus including a thermoelectric element; and an electric power converter which controls electric current when the thermoelectric element generates electric power. The electric power converter changes the electric current when the thermoelectric element generates the electric power to obtain electric power values $W_1$ and $W_2$ corresponding to at least two different electric current values $i_1$ and $i_2$, the electric current value $i_1$ being smaller than the electric current value $i_2$; the electric power converter estimates an electric current-electric power characteristic based on a combination of the electric current value $i_1$ and the obtained electric power value $W_1$ and a combination of the electric current value $i_2$ and the obtained electric power value $W_2$; the electric power converter obtains an electric current value at which maximum electric power can be obtained using the electric current—electric power characteristic; and the electric power converter controls the electric current such that a value of the electric current becomes equal to the electric current value at which the maximum electric power can be obtained when the thermoelectric element generates the electric power.

As described above, the electric current—voltage characteristic is represented by the equation, $W=i\times(V_0-k\times i)=i\times V_0-k\times i^2$. The electric current-voltage characteristic is obtained based on the combination of the electric current $i_1$ and the obtained electric power value $W_1$ and the combination of the electric current $i_2$ and the obtained electric power value $W_2$, and the electric current value $i_r$ is obtained using this electric current—voltage characteristic. More specifically, the electric current value $i_r$ may be obtained after the values of k and $V_0$ are obtained, or the electric current value $i_r$ may be stored in a storage device.

When plural electric current—electric power characteristics are estimated based on the combination of the electric current value $i_1$ and the obtained electric power value $W_1$ and the combination of the electric current value $i_2$ and the obtained electric power value $W_2$, the electric power converter may obtain one of a voltage value and an electric power value corresponding to an electric current value $i_3$, the electric current value $i_3$ being different from the electric current values $i_1$ and $i_2$, and the electric power converter may select the electric current—electric power characteristic from among the estimated plural electric current-electric power characteristics based on a combination of the electric current value $i_3$ and one of the voltage value and the electric power value corresponding to the electric current value $i_3$.

Ordinarily, the electric current—electric power characteristic varies depending on the two constant values $V_0$ and k. Therefore, when two combinations of the electric current value and the voltage value are obtained, the values of $V_0$ and k should be determined, and the electric current-electric power characteristic should be determined. However, since there is a limit to the accuracy of detecting the electric current value and the electric power value, the accuracy cannot be made higher than necessary. In the case where plural electric current—electric power characteristics are estimated when considering an error of each detected value or a change in the accuracy, another combination of the electric current value and the voltage value or the electric power value is obtained, and the electric current—electric power characteristic is selected from among the plural estimated electric current—electric power characteristics.

According to the invention, the electric current value and the voltage value or the electric power value are measured, and it is not necessary to provide an additional sensor in the thermoelectric module including the thermoelectric element. Therefore, heat resistance is not changed, and electric power generation efficiency is not reduced. Also, it is possible to accurately measure the electric current value, the voltage value, the electric power value, and the like using relatively low-cost sensors. Also, the responsiveness of these sensors is good. Accordingly, it is possible to promptly obtain the optimal electric current value at which the maximum electric power can be obtained. Also, it is possible to appropriately perform the electric current control even when there is a transient change in an engine operating state.

Also, these sensors can be included in the electric power converter. In this case, it is easy to assemble the electric power generating apparatus, and the manufacturing cost thereof can be reduced.

In the second aspect of the invention, when plural electric current-electric power characteristics are estimated based on the combination of the electric current value $i_1$ and the obtained electric power value $W_1$ and the combination of the electric current value $i_2$ and the obtained electric power value $W_2$, the electric power converter may obtain one of a voltage value and an electric power value corresponding to an electric current value $i_3$, the electric current value $i_3$ being different from the electric current values $i_1$ and $i_2$, and the electric power converter may select the electric current-electric power characteristic from among the estimated plural electric current-electric power characteristics based on a combination of the electric current value $i_3$ and one of the voltage value and the electric power value corresponding to the electric current value $i_3$.

In the second aspect of the invention, the electric power converter may include an ammeter that measures a value of electric current flowing in the thermoelectric element, and a voltmeter that measures a value of voltage between output terminals of the thermoelectric element.

In the second aspect of the invention, the electric power converter may include an ammeter that measures a value of electric current flowing in the thermoelectric element, and a wattmeter that measures a value of electric power output from the thermoelectric element.

In the second aspect of the invention, the thermoelectric element may include a high-temperature side end surface and a low-temperature side end surface, and may generate the electric power according to a temperature difference between the high-temperature side end surface and the low-temperature side end surface.

In the second aspect of the invention, the high-temperature side end surface may be provided in a vicinity of an exhaust passage of an automobile, and a cooling device may be provided on the low-temperature side end surface.

A third aspect of the invention relates to a control method for an electric power generating apparatus including a thermoelectric element; and an electric power converter which controls electric current when the thermoelectric element generates electric power. The control method includes the steps of changing the electric current when the thermoelectric element generates the electric power so as to obtain voltage values $V_1$ and $V_2$ corresponding to at least two different electric current values $i_1$ and $i_2$, the electric current value $i_r$ being smaller than the electric current value $i_1$; and controlling the electric current such that a value of the electric current becomes equal to an electric-current value $i_t$ when the thermoelectric element generates the electric power, the electric current value $i_t$ satisfying an equation, $$i_t=(i_2V_1-i_1V_2)/2(V_1-V_2).$$

A fourth aspect of the invention relates to a control method for an electric power generating apparatus including a thermoelectric element; and an electric power converter which controls electric current when the thermoelectric element generates electric power. The control method includes the steps of changing the electric current when the thermoelectric element generates the electric power so as to obtain electric power values $W_1$ and $W_2$ corresponding to at least two different electric current values $i_1$ and $i_2$, the electric current value $i_1$ being smaller than the electric current value $i_2$; and estimating an electric current—electric power characteristic based on a combination of the electric current value $i_1$ and the obtained electric power value $W_1$ and a combination of the electric current value $i_2$ and the obtained electric power value $W_2$, obtaining an electric current value at which maximum electric power can be obtained using the electric current—electric power characteristic, and controlling the electric current such that a value of the electric current becomes equal to the electric current value at which the maximum electric power can be obtained when the thermoelectric element generates the electric power.

BRIEF DESCRIPTION OF THE DRAWINGS

The foregoing and further objects, features and advantages of the invention will become apparent from the following description of preferred embodiments with reference to the accompanying drawings, wherein like numerals are used to represent like elements and wherein.

DETAILED DESCRIPTION OF THE PREFERRED EMBODIMENTS

Figure 1:
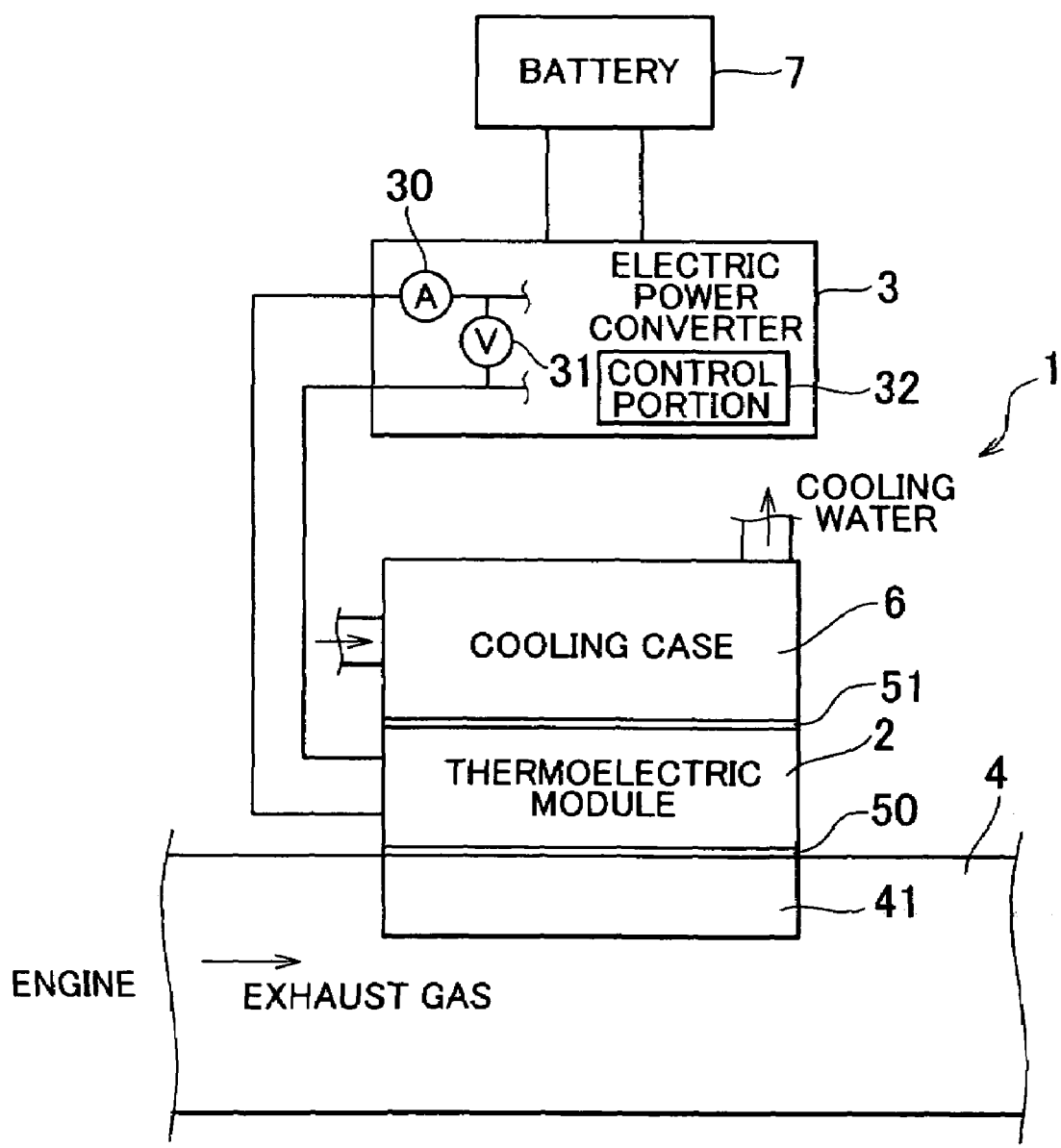
FIG. 1 is a schematic diagram showing a configuration of an electric power generating apparatus according to the invention.

Hereinafter, an exemplary embodiment of the invention will be described with reference to accompanying drawings. In order to facilitate understanding, components that are the same are denoted by the same reference numerals in the drawings as long as possible, and duplicate description will be omitted.

Figure 2:
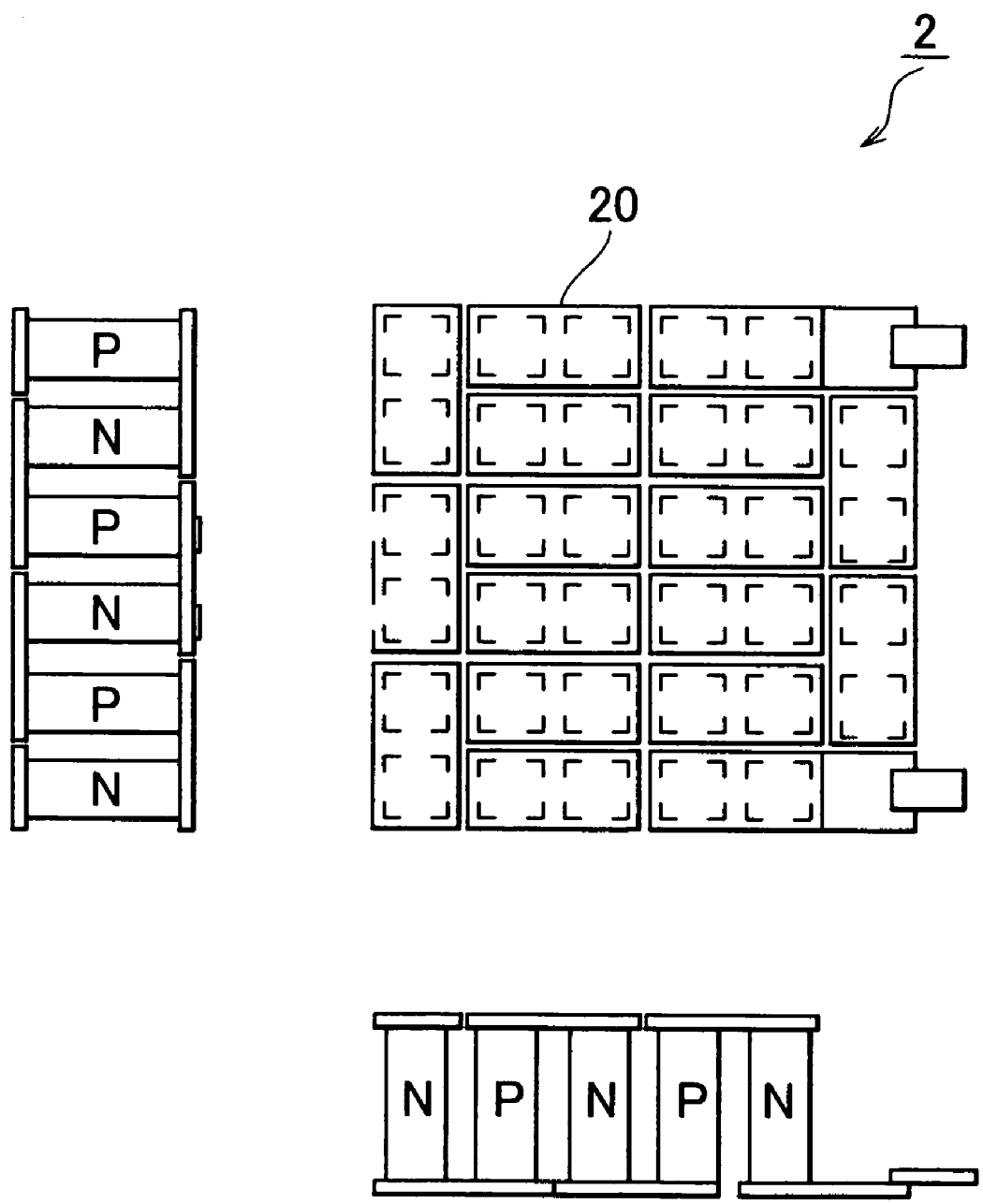
FIG. 2 is a diagram showing a configuration of a thermoelectric element in FIG. 1.

FIG. 1 is a schematic diagram showing a configuration of an electric power generating apparatus according to the invention. An electric power generating apparatus 1 is provided in an exhaust system of an automobile. The electric power generating apparatus 1 includes a thermoelectric module 2 which is formed by connecting multiple thermoelectric elements 20, and an electric power converter 3. As shown in FIG. 2, the thermoelectric element 20 is formed by connecting multiple p-type semiconductors and n-type semiconductors in a π shape. A high-temperature end side of the thermoelectric module 2 is fixed, through an insulating member 50, to an outer side of an exhaust pipe 4 in which exhaust gas flows. A low-temperature end side of the thermoelectric module 2 is connected, through an insulating member 51, to a cooling case 6 in which coolant flows. Both of the insulating members 50, 51 are insulators having good heat conduction. Both of the insulating members 50, 51 may be made of the same material. However, since the temperature of the insulating member 50 becomes high, at least the insulating member 50 needs to have good heat resistance.

An output terminal of the thermoelectric module 2 is electrically connected to the electric power converter 3. The electric power converter 3 houses an ammeter 30 for measuring an electric current value i that is the value of electric current flowing in the thermoelectric module 2, and a voltmeter 31 for measuring a voltage value V that is the value of voltage between output terminals. The electric power converter 3 includes a control portion 32 for performing electric current control, therein. The electric power converter 3 has a function of a DC-DC converter, and is connected to a battery 7. The control portion 32 includes a ROM, a RAM, a CPU, and the like. In the exhaust pipe 4, a heat sink 41 that is configured to have a fin shape is provided so that heat of exhaust gas can be efficiently transmitted to the thermoelectric module 2.

The heat sink 41 is heated by exhaust gas flowing in the exhaust pipe 4, and the temperature of the exhaust gas becomes high. A high-temperature side end surface of each thermoelectric element 20 is heated due to heat transmitted from the heat sink 41 through the insulating member 50. Meanwhile, since heat of a low-temperature side end surface is removed by the coolant flowing in the cooling case 6 due to heat transmission through the insulating member 51. Thus, the temperature of the high-temperature side end surface and the temperature of the low-temperature side end surface become different from each other. Electric current flows in the thermoelectric element 20 due to a Seebeck effect caused by the temperature difference, and electric power is obtained.

Figure 3:
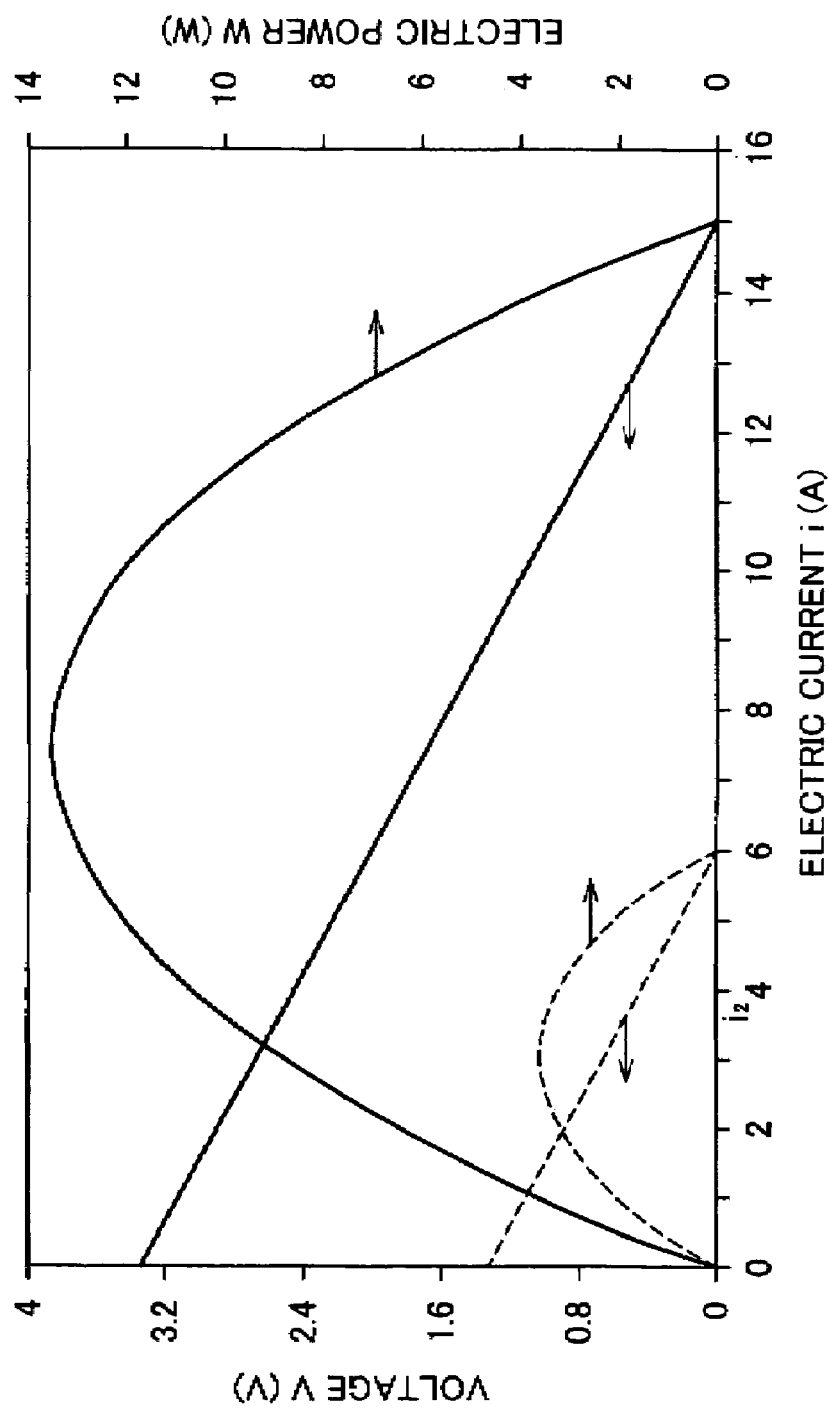
FIG. 3 is a graph showing an electric current (i)—voltage (V) characteristic, and an electric current (i)—electric power (W) characteristic of a thermoelectric module.

FIG. 3 is a graph showing an electric current (i)—voltage (V) characteristic of the thermoelectric module 2, and an electric current (i)—electric power (W) characteristic of the thermoelectric module 2. In FIG. 3, a solid line shows a case where the temperature of the high-temperature side end surface is Th1, and the temperature of the low-temperature side end surface is Tc1. A dashed line shows a case where the temperature of the high-temperature side end surface is Th2, and the temperature of the low-temperature side end surface is Tc2. The relationship among these temperatures is represented by an equation, (Th1−Tc1)>(Th2>Tc2).

As shown in FIG. 3, the electric current (i)—voltage (V) characteristic of the thermoelectric element varies depending on the temperatures of both the end surfaces. When the temperatures are in a given temperature range, the electric current (i)—voltage (V) characteristic of the thermoelectric element depends on the temperature difference between both the end surfaces. The relationship between the electric current i and the voltage V is represented by an equation (1) described below when the temperatures of both the end surfaces are given temperatures.

$$V = V_0 - k \times i \qquad (1)$$

$$0 \leq i \leq V_0/k \quad V=0 \quad i > V_0/k$$

In the equation (1), $V_0$ and k are constant values. When the temperature of the high-temperature side end surface and the temperature of the low-temperature side end surface are different from each other, the value of $V_0$ and the value of k are different from each other. That is, the values of $V_0$ and k depend on the temperature of the high-temperature side end surface and the temperature of the low-temperature side end surface. Since output electric power W that can be obtained is represented by an equation, $i \times V$, the output electric power in the case of "$0 \leq i \leq V_0/k$" is represented by an equation (2) described below.

$$W = i \times (V_0 - k \times i) = i \times V_0 - k \times i^2 \qquad (2)$$

Since the output electric power W is represented by a quadratic function which is convex upward, the maximum electric power Wmax is obtained at an inflection point. That is, the maximum electric power Wmax is obtained in the case of "dW/di=0". An electric current value $i_t$ at this time is represented by an equation (3) described below.

$$i_t = V_0 / (2 \times k) \qquad (3)$$

In the case where the electric power converter 3 controls the electric current flowing in the thermoelectric module 2 such that a value of the electric current becomes equal to the electric current value $i_t$ when the electric power is obtained, the electric power can be obtained most efficiently.

The electric power generating apparatus according to the embodiment controls the electric current such that the value of the electric current becomes equal to the electric current value $i_t$ when the electric power is obtained, without using a temperature sensor.

Figure 4:
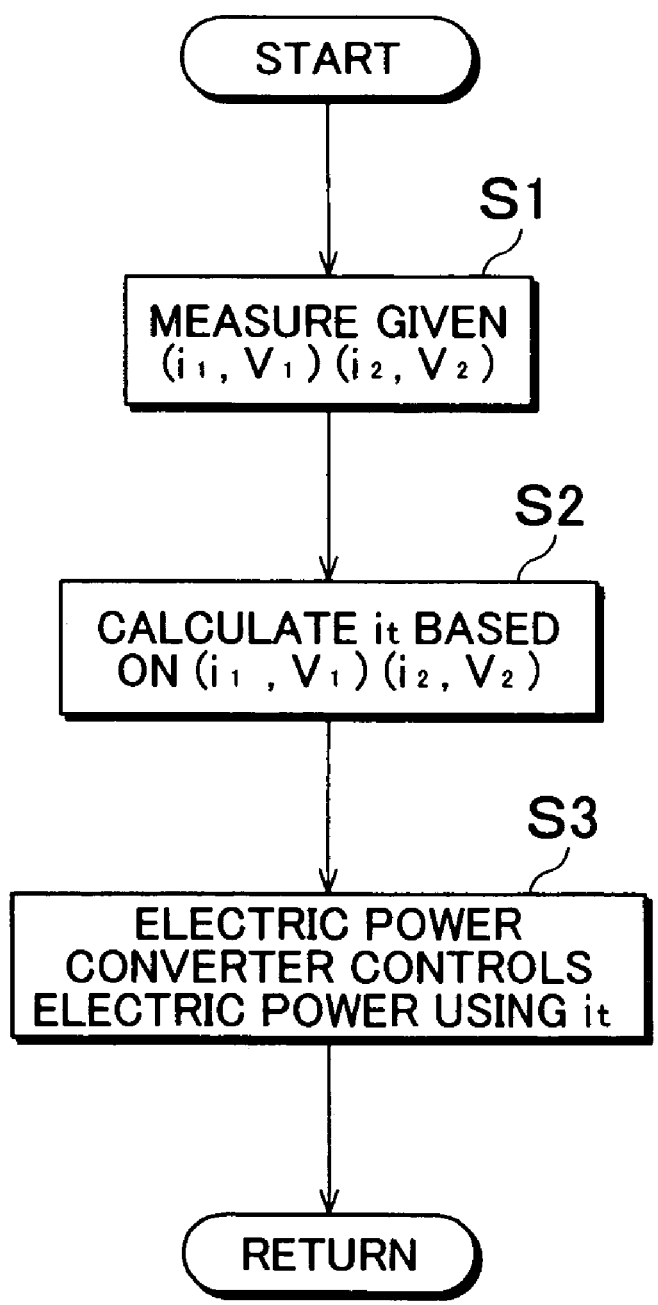
FIG. 4 is a flowchart showing an electric current control process in a first control mode performed by the electric power generating apparatus in FIG. 1.
Figure 5:
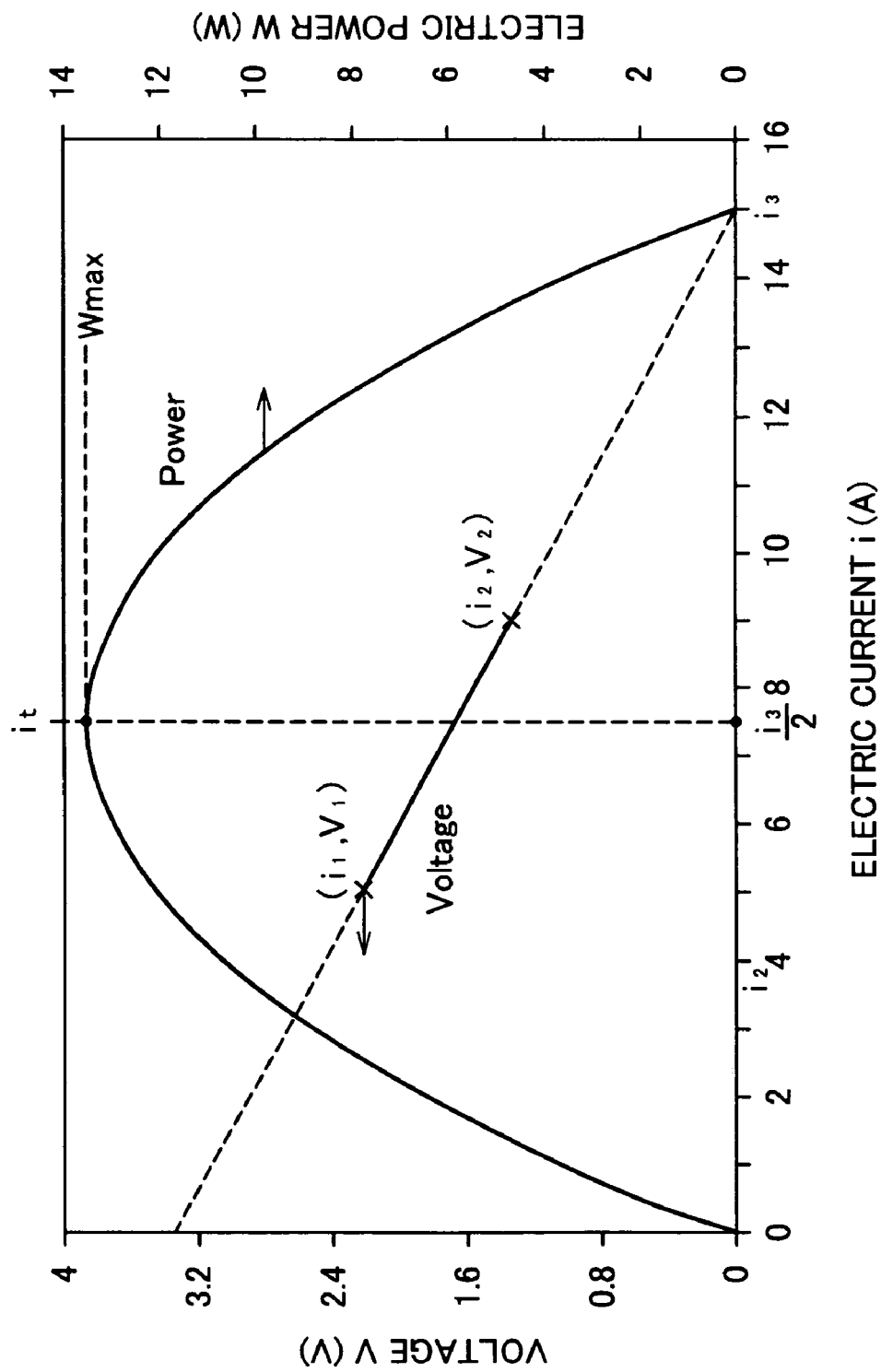
FIG. 5 is a graph explaining a method of calculating an optimal electric current value $i_t$ in the electric current control process in the first control mode.

The electric current control will be described specifically. FIG. 4 is a flowchart showing an electric current control process in a first control mode. FIG. 5 is a graph explaining a method of calculating the electric current value $i_t$ in the electric current control process in the first control mode. The electric current control process is performed by the control portion 32 of the electric power converter 3.

First, in step S1, the value of electric current is changed to an electric current value $i_1$ and an electric current value $i_2$ with reference to the result of measurement performed by the ammeter 30 when the electric power is obtained from the thermoelectric module 2. The relationship between the electric current values $i_1$ and $i_2$ is represented by an equation, $i_1 < i_2$. That is, the electric current value $i_1$ is smaller than the electric current value $i_2$. For example, it is preferable that the electric current value $i_2$ should be substantially equal to a value obtained by an equation, $2 \times i_1$. Then, a voltage value $V_2$ corresponding to the electric current value $i_1$, and a voltage value $V_2$ corresponding to the electric current value $i_2$ are detected, using the voltage meter 31.

The electric power converter 3 can instantly change the value of electric current supplied to the thermoelectric module 2. Therefore, two combinations of the electric current value and the voltage value can be detected in an extremely short time. That is, the speed at which the two combinations of the electric current value and the voltage value can be detected is extremely high, as compared to the speed at which the temperatures of the high-temperature side end surface and the low-temperature side end surface change. Accordingly, the changes in the temperatures before and after the electric current value is changed are negligible.

Next, the optimal electric current value $i_t$ is calculated (step S2). When the temperatures of the high-temperature side end surface and the low-temperature side end surface are the same, the electric current (i)—voltage (V) characteristic can be shown by one straight line. Since the combination of the electric current $i_1$ and the voltage value $V_1$ ($i_1$, $V_1$) and the combination of the electric current $i_2$ and the voltage value $V_2$ ($i_2$, $V_2$) are shown by two points on this straight line, the values of $V_0$ and k in the equation (1) can be calculated using these two points, as follows.

$$V_0 = (i_2 V_1 - i_1 V_2)/(i_2 - i_1) \qquad (4)$$

$$k = (V_1 - V_2)/(i_2 - i_1) \qquad (5)$$

After the values of $V_0$ and k are obtained, the optimal electric current value $i_t$ can be calculated according to the equation (3).

The optimal electric current value $i_t$ may be directly obtained based on the combinations of the electric current value and the voltage value ($i_1$, $V_1$) and ($i_2$, $V_2$), according to an equation (6) described below, without calculating the values of $V_0$ and k separately.

$$i_t = (i_2 V_1 - i_1 V_2)/[2 \times (V_1 - V_2)] \qquad (6)$$

Also, an electric current value $i_3$ ($= V_0/k$) that is an i-axis intercept when the voltage value becomes 0 may be obtained, and the optimal electric current value it may be obtained as a half of the electric current value $i_3$.

Further, the optimal electric current value $i_t$ may be calculated by reading out, from a map stored in the electric power converter 3, the optimal electric current value $i_t$ corresponding to the combinations of the electric current value and the voltage value, ($i_1$, $V_1$) and ($i_2$, $V_2$).

In each of the aforementioned cases, the obtained optimal electric current value $i_t$ matches the optimal electric current value $i_t$ represented by the equation (6), and is included in the scope of the invention.

In step S3, the electric power generation state of the thermoelectric module 2 is controlled such that the electric current value becomes equal to the optimal electric current value $i_t$, with reference to the output of the ammeter 30.

Thus, since thermoelectric power generation can be performed at the optimal electric current value without using an temperature sensor, heat energy of the exhaust gas can be efficiently converted to electric energy, and the electric energy can be recovered.

For example, in the case where the temperatures and the flow amounts of the coolant and exhaust gas change, or in the case where a sufficient time has not elapsed since the engine is started, and therefore the temperature of the thermoelectric module 2 itself is low and the temperature of the high-temperature side end surface has not been sufficiently increased, the temperatures of the high-temperature side end surface and the low-temperature side end surface also change. Therefore, it is preferable that the optimal electric current value $i_t$ should be determined considering a transient change in an engine operating state.

Accordingly, for example, the process of setting the optimal electric current value $i_t$ shown in FIG. 4 is performed at predetermined timing. In other words, the process of setting the optimal electric current value $i_t$ may be always performed at constant time intervals, or the time intervals at which the process of setting the optimal electric current value $i_t$ is repeatedly performed may be variable. For example, it may be determined whether an engine operating state is a steady state or a transient state based on a signal from an engine ECU (not shown) for controlling the engine, and when the engine operating state is the transient state, the time intervals at which the setting process is performed may be made short, as compared to when the engine operating state is the steady state. Alternatively, when the optimal electric current value $i_t$ changes by a large amount as compared to the value $i_t$ that is previously set, the time intervals at which the setting process is performed may be made short, and when the optimal electric current value $i_t$ changes by a small amount, the time intervals may be made long.

According to the invention, since the optimal operation of the thermoelectric module can be performed using a simple configuration, the electric power can be efficiently generated. Also, since it is easy to maintain a good heat transmission state between the thermoelectric module and the heat source (i.e., exhaust gas and the coolant), the electric power generation efficiency can be improved. Also, an existing electric power generating apparatus can be performed with higher efficiency by providing the electric power converter 3.

Figure 6:
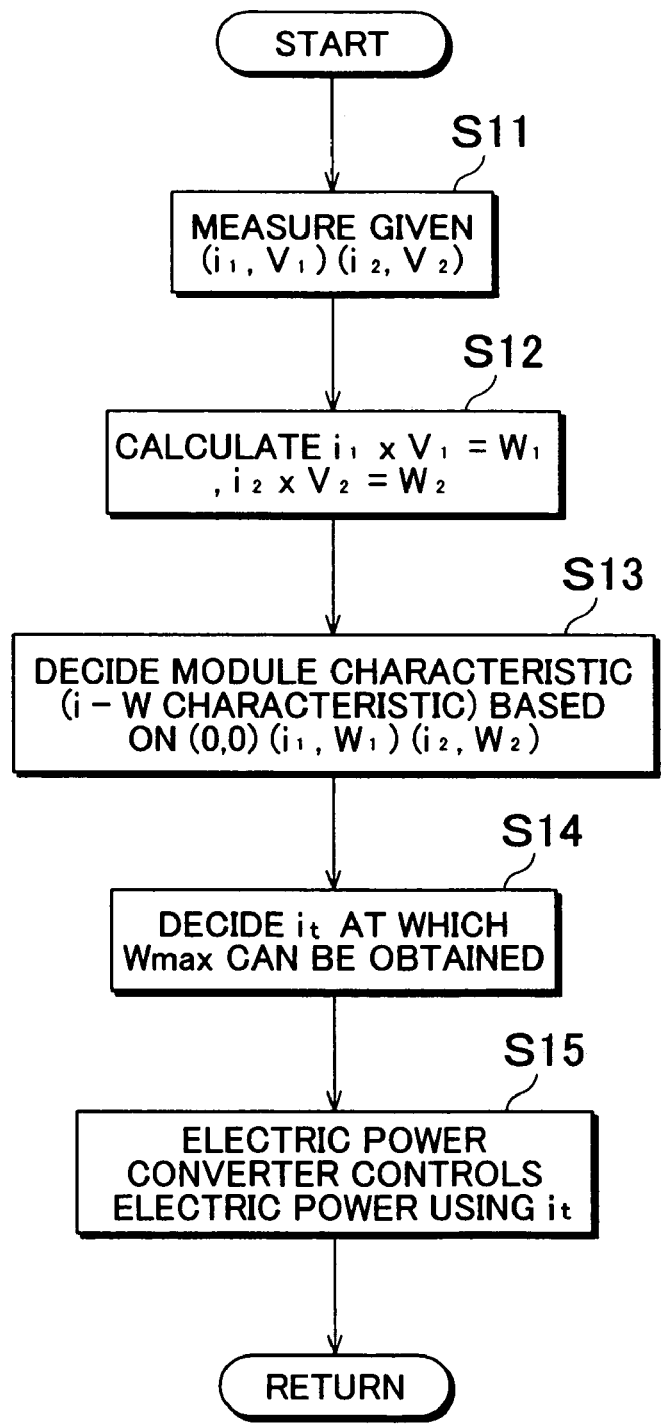
FIG. 6 is a flowchart showing an electric current control process in a second control mode performed by the electric power generating apparatus in FIG. 1.
Figure 7:
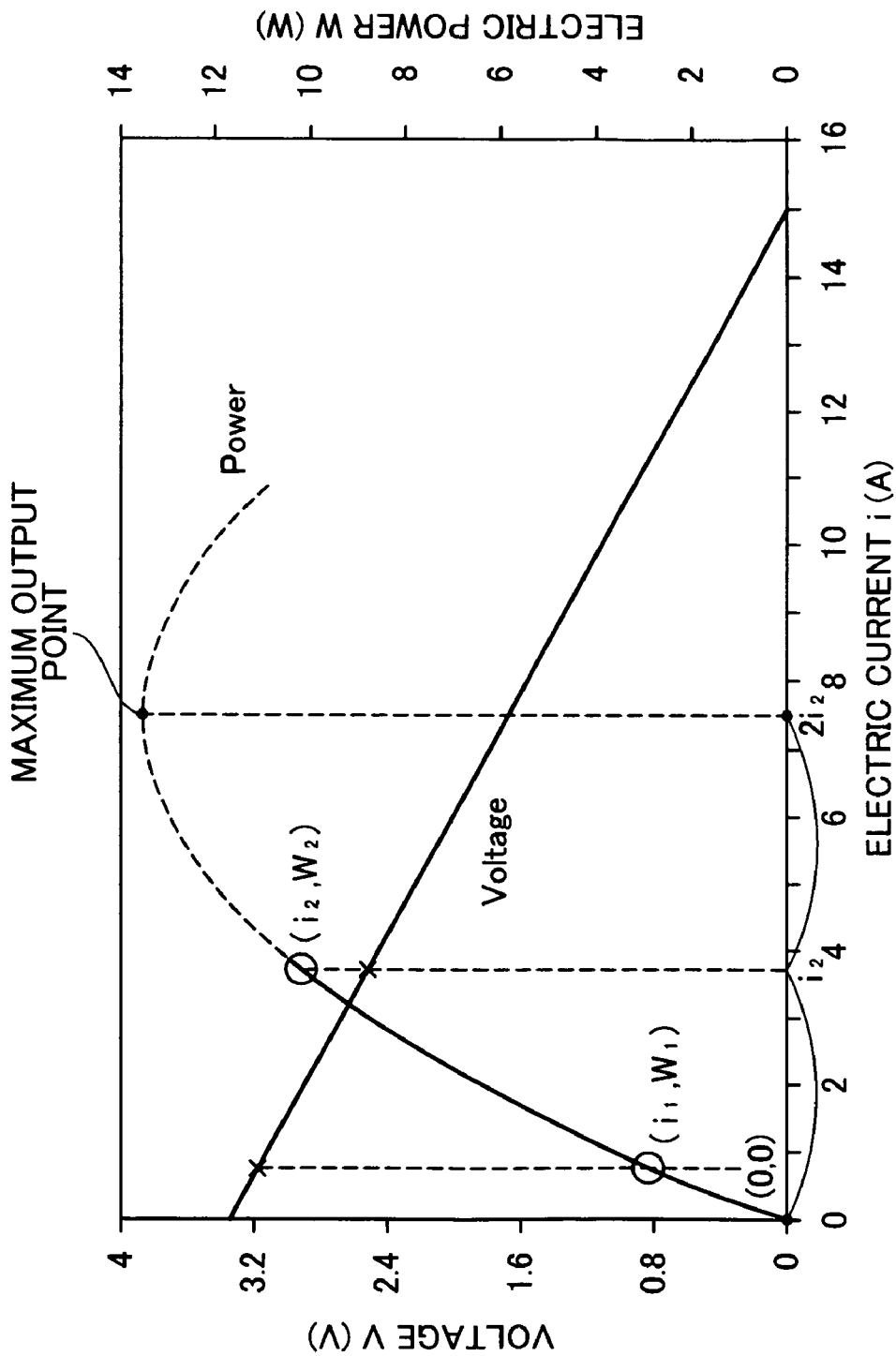
FIG. 7 is a graph explaining a method of calculating the optimal electric current value $i_t$ in the electric current control process in the second control mode.

Next, an electric current control process in a second control mode will be described. FIG. 6 is a flowchart showing the electric current control process in the second control mode. FIG. 7 is a graph explaining a method of calculating the optimal electric current value $i_t$ in this electric current control process in the second control mode. This electric current control process is performed by the control portion 32 of the electric power converter 3, as in the case of the electric current control process in the first control mode.

First, in step S11, the value of the electric current is changed to the electric current value $i_1$ and the electric current value $i_2$ with reference to the result of measurement performed by the ammeter 30 when the electric power is obtained from the thermoelectric module 2. The relationship between the electric current values $i_1$ and $i_2$ is represented by an equation, $i_1 < i_2$. That is, the electric current value $i_1$ is smaller than the electric current value $i_2$. For example, it is preferable that the relationship between the electric current values $i_1$ and $i_2$ should be represented by an equation, $i_2 \leq 2 \times i_1$. Then, the voltage value $V_1$ corresponding to the electric current value $i_1$, and the voltage value $V_2$ corresponding to the electric current value $i_2$ are detected, using the voltage meter 31.

Next, an electric power amount $W_1$ in the case where the electric current value is $i_1$ and the voltage value is $V_1$, and an electric power amount $W_2$ in the case where the electric current value is $i_2$ and the voltage value is $V_2$ are calculated (step S12). The electric power amount $W_1$ is represented by an equation, $W_1 = i_1 \times V_1$. The electric power amount $W_2$ is represented by an equation, $W_2 = i_2 \times V_2$.

Then, a calculation is performed to obtain an electric current value (i)-electric power (W) characteristic curve which passes through three points (0, 0), ($i_1$, $W_1$), and ($i_2$, $W_2$). The characteristic curve is represented by the equation (2). The values of $V_0$ and k can be obtained according to equations (7) and (8) described below.

$$V_0 = (i_2^2 W_1 - i_1^2 W_2)/\{i_1 \times i_2 \times (i_2 - i_1)\} \quad (7)$$

$$k = (i_2 \times W_1 - i_1 \times W_2)/\{i_1 \times i_2 \times (i_2 - i_1)\} \quad (8)$$

After the values of $V_0$ and k are obtained, the optimal electric current value $i_t$ can be obtained according to the equation (3) (step S14).

The optimal electric current value $i_t$ may be calculated by reading out, from a map stored in the electric power converter 3, the values of $V_0$ and k corresponding to the combinations of the electric current value and the electric power value ($i_1$, $W_1$) and ($i_2$, $W_2$), instead of calculating the values of $V_0$ and k using the equations (7) and (8).

In step S15, the electric power generation state of the thermoelectric module 2 is controlled such that the electric current value becomes equal to the optimal electric current value $i_t$, with reference to the output of the ammeter 30.

In this case, the electric power amount is obtained based on the electric current value and the voltage value. However, an electric power value may be obtained by providing a wattmeter instead of the voltmeter 31 shown in FIG. 1. Also, the electric power value may be obtained based on the amount of electric power supplied to the battery 7.

Figure 8:
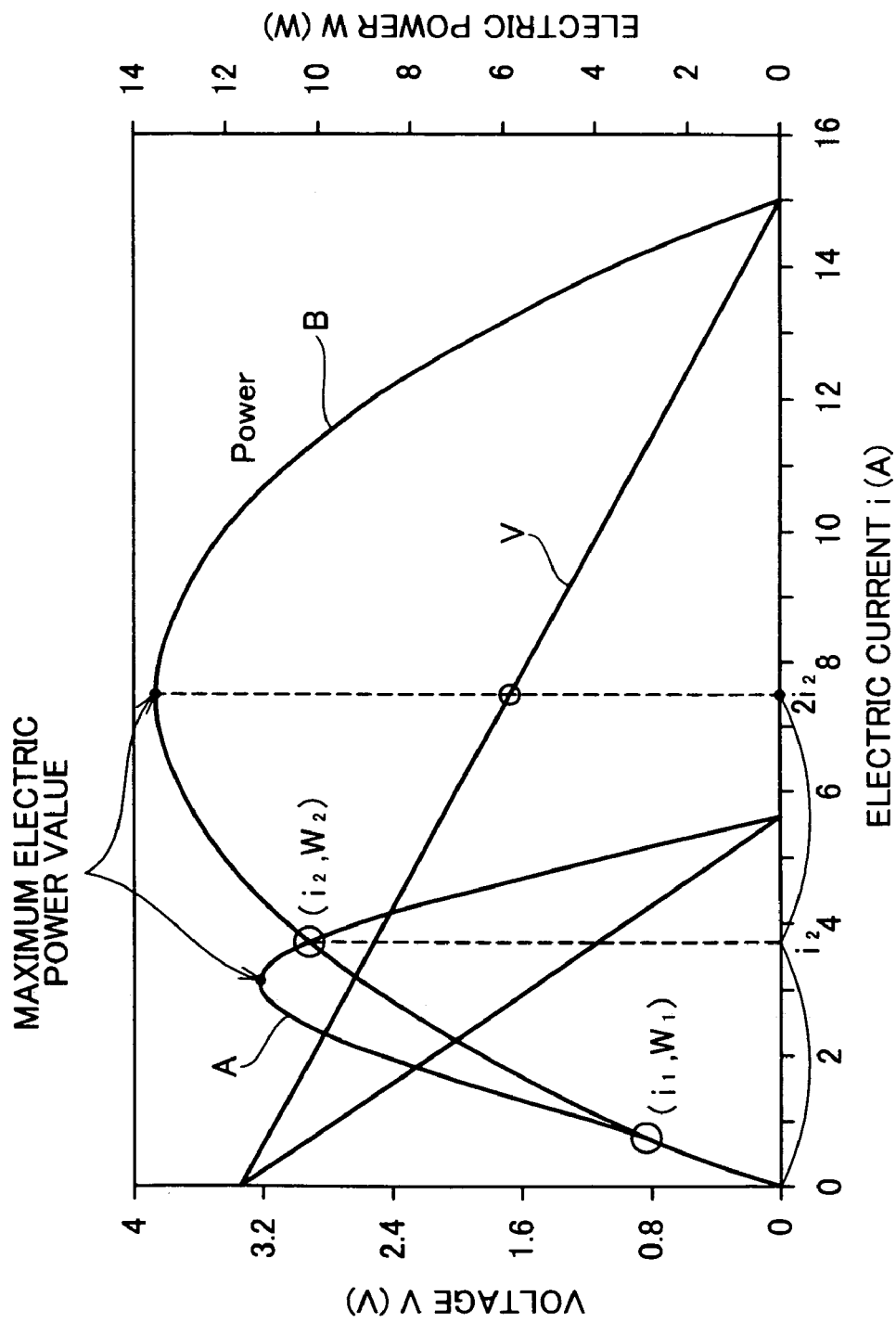
FIG. 8 is a graph explaining estimation of the characteristic in a case where accuracy of a measuring device is low when performing the electric current control process in the second control mode.
Figure 9:
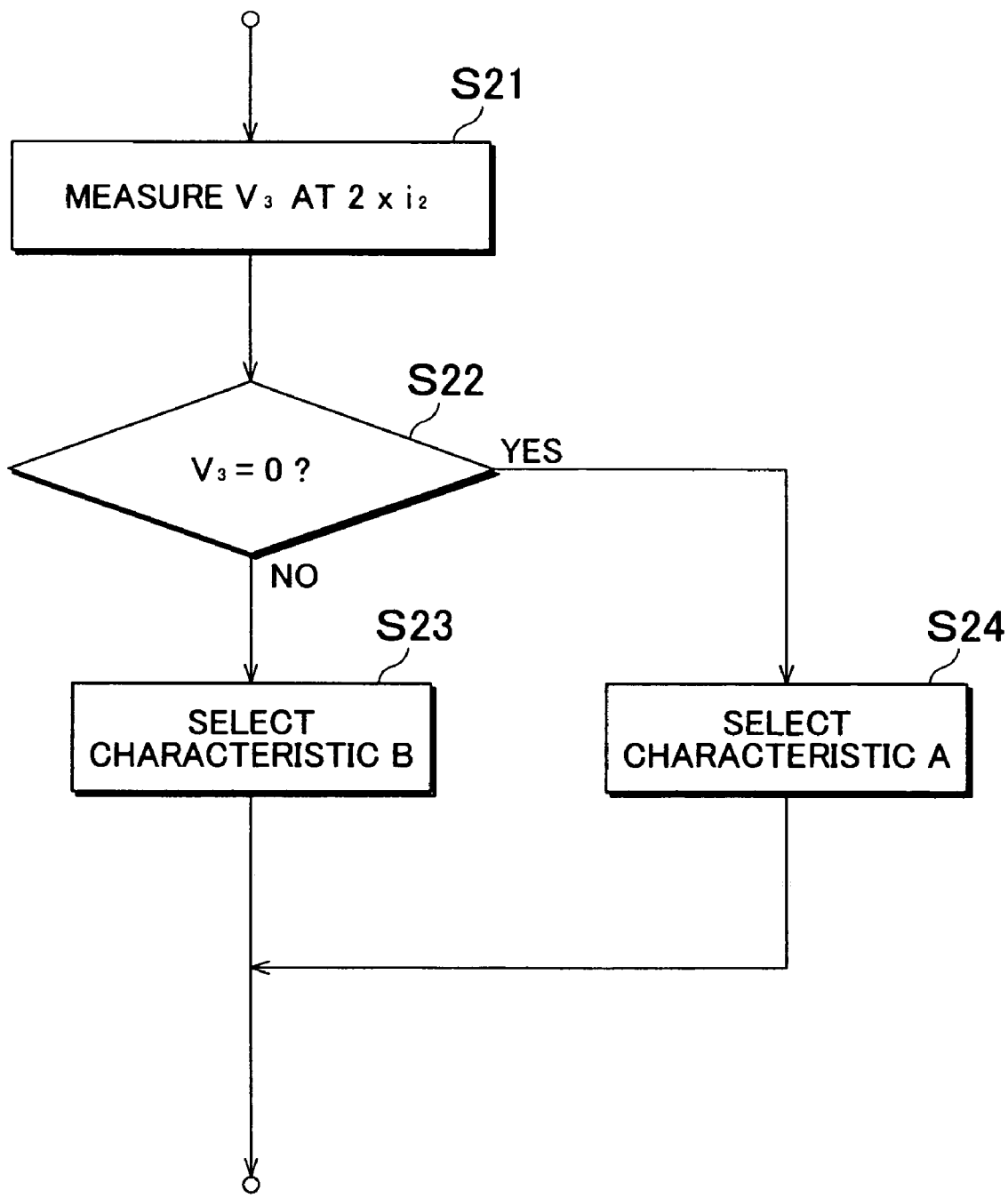
FIG. 9 is a flowchart showing a characteristic discrimination process in the case shown in FIG. 8.

Meanwhile, each of the output values of the ammeter, the voltmeter, and the wattmeter has an error. When the accuracy of each measuring device is relatively low, there may be plural electric current (i)—electric power (W) characteristic lines which pass through the two points ($i_1$, $W_1$) and ($i_2$, $W_2$), as shown in FIG. 8, considering the error. Hereinafter, description will be made of an electric current control process by which the optimal electric current value $i_t$ can be obtained with high accuracy even when using a measuring device having relatively low accuracy. FIG. 9 is a flowchart showing part of this control process. This control process is inserted between step S13 and step S14 of the control process shown in FIG. 6.

In step S13, characteristic lines A and B shown in FIG. 8 are decided as candidates for the electric current (i)—electric power (W) characteristic line. Further, in step S21, the electric current value is changed to a value obtained by $2 \times i_2$, with reference to the result of measurement performed by the ammeter 30. The voltage value V3 at this time is obtained.

In step S22, the voltage value V3 and 0 are compared to each other. When the voltage value V3 is not 0, the characteristic line B is selected (step S23). When the voltage value V3 is 0, the characteristic line A is selected (step S22). Thus, the optimal electric current value $i_t$ can be obtained with high accuracy.

In this case, the voltage value corresponding to the electric current value $2 \times i_2$ is additionally obtained. However, when the wattmeter is provided, the electric power value corresponding to the electric current value $2 \times i_2$ may be obtained. Also, the electric current value when the voltage value or the electric power value is additionally obtained is not limited to the value obtained by $2 \times i_2$. One of the two electric current values may be made a candidate for the optimal electric current value, or an electric current value $k \times i_2$ (it is preferable that the value of k should be larger than 1, and should be equal to or smaller than 2) may be used.

In these control modes as well, the same effects as in the first control mode can be obtained.

Description has been made of a thermoelectric power generating apparatus provided in an exhaust system of an automobile. However, the invention is not limited to this. The invention can be applied to, for example, a thermoelectric power generating apparatus which converts heat energy of combustion gas of various types of internal combustion engines or combustion devices, or heat energy of drain warm water to electric energy and recovers the electric energy.

What is claimed is:

1. An electric power generating apparatus comprising:
a thermoelectric element; and
an electric power converter which controls electric current when the thermoelectric element generates electric power, wherein the electric power converter changes the electric current when the thermoelectric element generates the electric power so as to obtain voltage values $V_1$ and $V_2$ corresponding to at least two different electric current values $i_1$, and $i_2$, the electric current value $i_1$ being smaller than the electric current value $i_2$; and the electric power converter controls the electric current such that a value of the electric current becomes equal to an electric current value $i_t$ when the thermoelectric element generates the electric power, and wherein the electric power converter is programmed to control the electric current satisfying the electric current value $i_t$ according to an equation, $$i_t=(i_2V_1-i_1V_2)/2(V_1-V_2).$$

2. The electric power generating apparatus according to claim 1, wherein the electric power converter includes an ammeter that measures a value of electric current flowing in the thermoelectric element, and a voltmeter that measures a value of voltage between output terminals of the thermoelectric element.

3. The electric power generating apparatus according to claim 1, wherein the thermoelectric element includes a high-temperature side end surface and a low-temperature side end surface, and generates the electric power according to a temperature difference between the high-temperature side end surface and the low-temperature side end surface.

4. The electric power generating apparatus according to claim 3, wherein the high-temperature side end surface is provided in a vicinity of an exhaust passage of an automobile, and a cooling device is provided on the low-temperature side end surface.

* * * * *